(12) United States Patent
Nishio et al.

(10) Patent No.: US 6,471,779 B1
(45) Date of Patent: Oct. 29, 2002

(54) GAS FEED CERAMIC STRUCTURE FOR SEMICONDUCTOR-PRODUCING APPARATUS

(75) Inventors: Akifumi Nishio; Masahiro Hori, both of Nagoya; Naohito Yamada, Kasugai, all of (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/558,058

(22) Filed: Apr. 26, 2000

(30) Foreign Application Priority Data

Apr. 30, 1999 (JP) .............................. 11-124959

(51) Int. Cl.⁷ .............................................. C23C 16/00
(52) U.S. Cl. ...................... 118/724; 118/715; 118/728; 156/345.34; 156/345.53
(58) Field of Search ................................ 118/715, 724, 118/728; 156/345, 345.34, 345.53

(56) References Cited

U.S. PATENT DOCUMENTS

| | | | | | |
|---|---|---|---|---|---|
| 5,350,479 A | * | 9/1994 | Collins | ...................... | 156/345 |
| 5,356,476 A | * | 10/1994 | Foster | ...................... | 118/715 |
| 5,422,139 A | * | 6/1995 | Fischer | ...................... | 118/715 |
| 5,624,498 A | * | 4/1997 | Lee | ...................... | 118/715 |
| 5,841,624 A | * | 11/1998 | Xu | ...................... | 361/234 |
| 5,903,428 A | * | 5/1999 | Grimard | ...................... | 361/234 |
| 6,134,096 A | * | 10/2000 | Yamada | ...................... | 361/234 |

FOREIGN PATENT DOCUMENTS

| | | | | |
|---|---|---|---|---|
| DE | 3715644 | * | 12/1988 | |
| JP | 60-98629 | * | 6/1985 | .................. 156/345 |

* cited by examiner

Primary Examiner—Richard Bueker
(74) Attorney, Agent, or Firm—Burr & Brown

(57) ABSTRACT

A gas feed ceramic structure for feeding a gas into a semiconductor-producing apparatus, includes a planar substrate having a gas-feeding surface and a rear surface. The planar substrate has depressions formed from the rear surface toward the gas-feeding surface to define thin portions between the depressions and the gas-feed surface. Each of the thin portions includes a plurality of gas feed holes for feeding the gas to a side of the gas-feeding surface of the substrate, and one open end of the gas feed holes is provided at the gas-feeding surface of the substrate, and the other open end faces the depressions.

10 Claims, 6 Drawing Sheets

GAS FEED CERAMIC STRUCTURE FOR SEMICONDUCTOR-PRODUCING APPARATUS

FIELD OF THE INVENTION

The present invention relates to gas-feed ceramic structures, such as shower plates, for use in semiconductor-producing apparatuses.

BACKGROUND OF THE INVENTION

In order to feed a processing gas to the semiconductor wafer, a so-called shower plate is used. With increase in the high frequency electric power and in plasma density, it is important to uniformly feed the processing gas in a space above the semiconductor wafer. If the gas-feeding state is macro-scopically or microscopically non-uniform, arching or glow discharging occurs between parallel planar electrodes in generating plasma between the electrodes. Consequently, dielectric breakdown is likely to occur in the processing gas.

Further, it is known that arching is likely to occur in feeding the processing gas into the space above the surface of the semiconductor wafer through the shower plate. It is said that reduction in diameter of holes of the shower plate is effective to prevent the arching. For this purpose, it is known that the shower plate is provided with gas feed holes each having a diameter of 0.5 mm and a length of 10 mm.

However, it is difficult to prevent the arching by thinning the gas feed holes like this. For example, it is thought effective to reduce the diameter of the gas feed hole to not more than 0.1 mm so as to particularly effectively prevent the arching. Nevertheless, it is practically impossible to form gas feed holes, for example, having a diameter of 0.1 mm over a length of 10 mm in the ceramic shower plate.

Although not difficult to form such gas feed holes in a diameter of around 0.5 mm over a length of 10 mm in the ceramic shower plate, steps are likely to be formed on the inner wall surfaces of the gas feed holes, which readily results in turbulence. It is not practical from the working time period and from cost performance to form a sufficiently great number of such gas feed holes as having a relatively small diameter in the shower plate. Owing to this, the distance between the adjacent gas feed holes in the shower plate tends to be lower, so that the blow-out pressure through the gas feed holes becomes high. Such causes are likely to produce turbulence or swirling of the gas in the space above the semiconductor wafer. For this reason, it is difficult to effectively prevent the arching by decreasing the diameter of the gas feed holes.

SUMMARY OF THE INVENTION

It is an object of the present invention to provide a gas feed ceramic structure for feeding a gas into a semiconductor-producing apparatus, in which the gas feed structure can stabilize the gas-fed state over a wide range, prevent the gas from non-uniformly flowing and thereby suppress the arching.

The gas feed ceramic structure for feeding a gas into a semiconductor-producing apparatus according to the present invention, comprising a planar substrate having a gas-feeding surface and a rear surface, the planar substrate comprising depressions formed from the rear surface toward the gas-feeding surface to define thin portions between the depressions and the gas-feed surface, each of the thin portions comprising a plurality of gas feed holes for feeding the gas to a side of the gas-feeding surface of th e substrate, one open end of the gas feed holes being provided at the gas-feeding surface of the substrate and the other facing the depressions.

These and other objects, features and advantages of the invention will be appreciated upon reading the following description of the invention when taken in conjunction with the attached drawings, with the understanding that some modifications, variation and changes of the same could be made by the skilled person in the art to which the invention pertains.

BRIEF DESCRIPTION OF THE DRAWINGS

For a better understanding of the invention reference is made to the attached drawings, wherein.

DETAILED DESCRIPTION OF THE INVENTION

In the following, the present invention will be explained with reference to the drawings as the case may be, including its functions and effects.

Figure 1A:
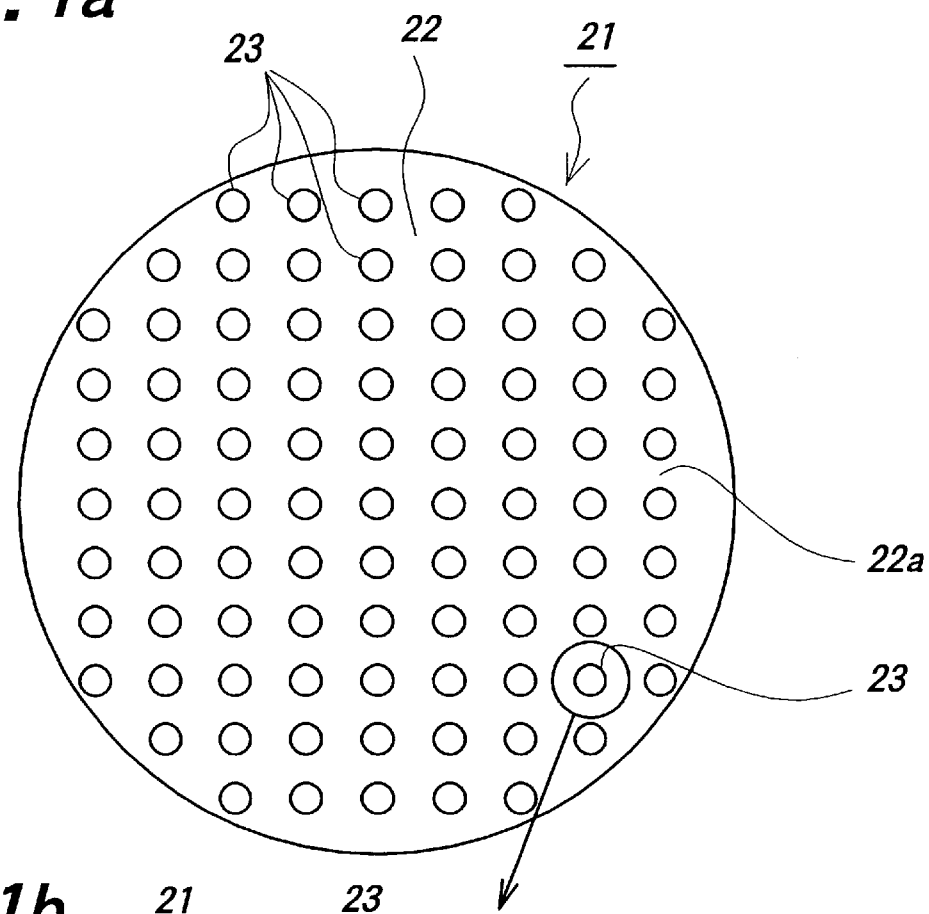
FIG. 1a is a bottom view of a shower plate as an embodiment of the gas feed ceramic structure according to the present invention as viewed from a side of a rear surface thereof.
Figure 1B:
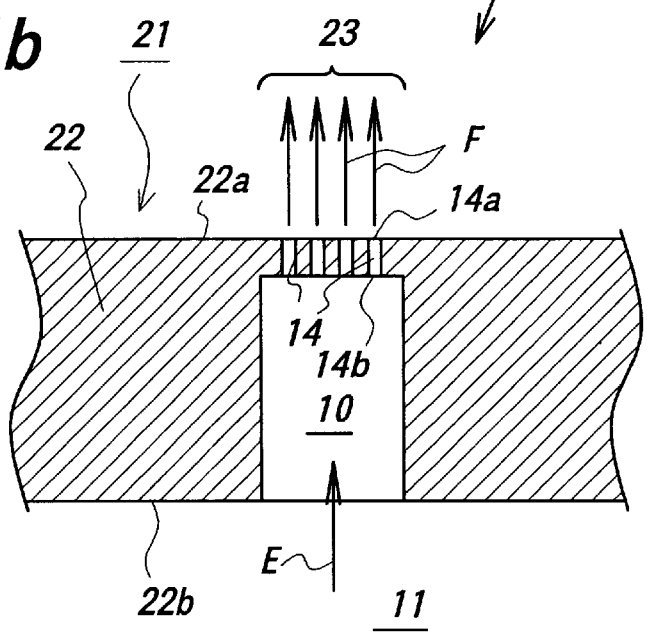
FIG. 1b is an enlarged sectional view of a part of the shower plate.

FIG. 1a and FIG. 1b are a bottom view of a shower plate 21 as an embodiment of the gas feed ceramic structure according to the present invention as viewed from a side of a rear surface thereof, and an enlarged sectional view of a part of the shower plate, respectively. The shower plate is a typical example of the gas feed devices which feed a semiconductor-processing gas into a space above the semiconductor in the semiconductor-producing apparatus.

The shower plate 21 includes a substrate 22 made of a ceramic material in an almost round discoid shape in this embodiment. A gas-feeding surface 22a of the substrate 22 is faced with a semiconductor wafer not shown. The shower plate 21 is provided with depressions 10 formed from a rear surface 22b toward the gas-feeding surface 22a to define thin portions 23 between the depressions 10 and the gas-feed surface 22a. As shown schematically in FIG. 1 for example, the thin portions 23 are provided in a grid pattern, vertically and laterally at respective constant pitches. The spaces 10 open to the rear surface 22b in the substrate at locations corresponding to the thin portions 23, respectively. Each of the thin portions 23 comprises a plurality of gas feed holes 14, and one open end 14a of the gas feed holes 14 are formed at the gas-feeding surface 22a of the substrate, the other 14a facing the depressions 10.

When a semiconductor wafer is to be subjected to plasma etching or film-forming, the interior of a chamber is evacuated to vacuum, a certain semiconductor-processing gas is fed into the depressions 10 from a space 11. This gas flows into the gas feed holes 14 through the depressions 10, and blows out as shown by arrows F.

The present inventors noted the microscopic configuration of the holes influenced by the difficulty of working the ceramics. That is, the thickness of the substrate of the shower plate is around 10 mm, for example. It is generally difficult to form through holes in such a thick ceramic planar substrate from the gas-feeding surface 22a toward the rear surface 22b. For example, if the planar substrate 22 is made of a hard and dense ceramic material such as aluminum nitride, silicon nitride or alumina, for example, it is necessary to exchange a cutting tool on the way of working. Further, since the substrate 22 is thick, it is actually difficult to bore a hole by laser working or etching, because a large taper is formed from one end opening to the other of a gas feed opening. For this reason, ultrasonic mechanical working is necessary. Even in this case, a considerably large taper is formed in a gas feed hole as viewed diametrically, so that the diameter of the one end opening of the gas feed hole differs from that of the other.

Such a difference increases with increase in the thickness of the substrate. Further, the substrate cannot be worked at one time over the entire thickness, which produces a stair step-like portion at an inner wall surface of the gas feed hole. Such factors are likely to cause the turbulence or swirling of the gas when the gas is flown through the gas feed hole.

To the contrary, the present inventors tried to form thin portions 23 at those areas of a substrate 22 where gas feed holes would be conventionally formed, and form a plurality of such gas feed holes 14 in the thin portions. Even gas feed holes 14 having small diameters can be worked if their lengths are small, while the tapering of the gas feed hole and the formation of the stepped portion at the inner wall surface of the gas feed hole as mentioned above can be prevented.

In addition, while the gas is in the depression 10, there is no factor that causes turbulence or swirling, and almost uniform pressure is kept. Then, the gas passes through the gas feed holes 14 as shown in arrows F, and fed in the space above the semiconductor wafer.

During this, the gas is unlikely to form turbulence or swirl inside the gas supply holes 14, since there are almost no steps at the inner wall surface of each of the gas feed holes 14. Turbulence and swirling are prevented inside the depressions 10, and the length of the gas feed holes 14 is short. The flow rate of the gas ejected from each gas feed hole 14 is small. Further, as compared with a case where small-diameter holes are merely provided without thin portions, the areas of the thin portions are so wide that the gas can be uniformly and stably fed from over a wide range. For these reasons, it is considered that non-uniformity such as local turbulence and swirling can be suppressed in the space above the semiconductor wafer.

Further, the gas feed structure according to the present invention is applicable to the semiconductor wafer holders such as the electrostatic chuck and the high frequency voltage generating electrode apparatus.

It is necessary to keep the temperature of the surface of the semiconductor wafer uniform when forming a semiconductive film on the surface of the wafer in a case that the semiconductor wafer is held by the electrostatic chuck and heated with infrared rays or in a case that the electrostatic chuck itself generates heat to heat the semiconductor wafer. If this surface temperature is non-uniform, the thickness of the semiconductor film heaped on the surface of the wafer becomes non-uniform, which makes the semiconductor defective. To prevent this, it is known that the temperature distribution is suppressed to a narrower range by flowing the backside gas between the gas-feeding surface of the electrostatic chuck and the semiconductor wafer.

When the semiconductor wafer is to be cleaned with plasma that is generated above the semiconductor wafer by applying high frequency voltage to electrodes in the electrostatic chuck, the semiconductor wafer is heated through receiving heat from the plasma. At that time, when a cooler is installed at a side of the rear surface of the electrostatic chuck and the backside gas is flown between the gas-feed surface of the electrostatic chuck and the semiconductor wafer so that the temperature of the semiconductor wafer may be made constant and the temperature distribution thereof may be narrow, heat that enters or would enter the semiconductor wafer from the plasma can be escaped to the electrostatic chuck and the cooler through the backside gas.

The reason why the backside gas is necessary is as follows. That is, if the gas-feeding surface of the electrostatic chuck is directly brought into contact with the semiconductor wafer, the space between them being in a pressure-reduced state increases a temperature difference between them and variations in temperature of the semiconductor wafer. This is because almost no heat conduction occurs through convection between the gas-feed surface and the semiconductor wafer under reduced pressure or vacuum, heat transfer occurs almost exclusively through radiation, and heat insulation effect is extremely high even if only a sight gap exists between them. heat transfer occurs almost exclusively through radiation, and heat insulation effect is extremely high even if only a sight gap only exists between them.

On the other hand, heat is transferred through convection between the semiconductor wafer and the gas-feeding surface when the backside gas is flown between them, so that difference in temperature between the semiconductor wafer and the gas-feeding surface 2a becomes microscopically smaller and that variations in the surface temperature of the semiconductor wafer decrease.

Figure 2:
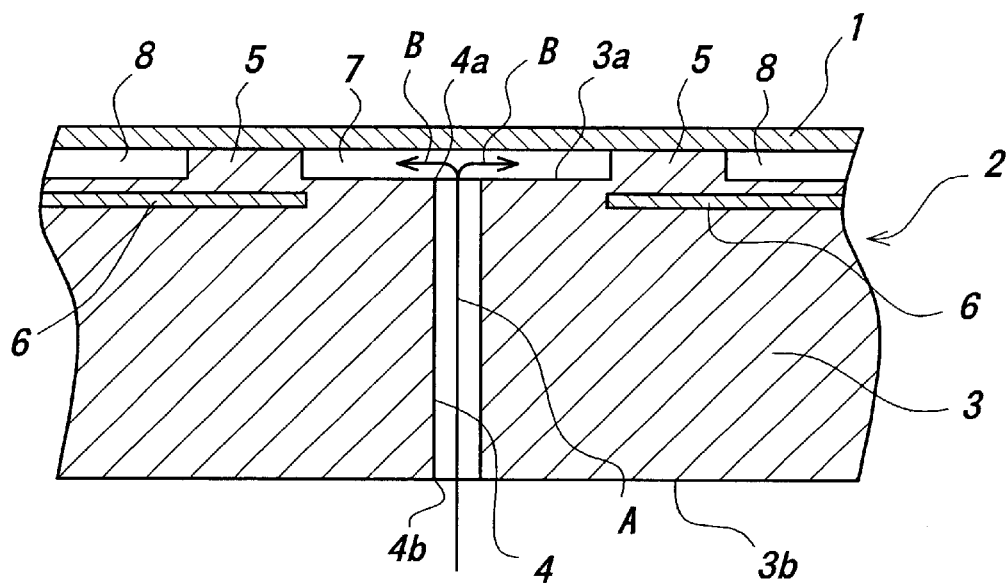
FIG. 2 is a sectional view of a conventional electrostatic chuck.

In order to feed the backside gas, as schematically and sectionally shown in FIG. 2, gas feed hole 4 is conventionally formed in a substrate 3, extending to a gas-feeding surface 3a from a back surface 3b. Reference numerals 5 and 6 are an embossed portion projecting from the gas-feeding surface and an electrode, respectively. A reference numeral 1 is a semiconductor wafer. When the backside gas is flown through the gas feed hole 4 as shown by an arrow A after evacuating a chamber to vacuum, the gas blows out through an opening 4a, and flows into the space 7 as shown by arrows B and through gas flow paths 8 among the embossed portions 5.

However, there remain the following problems. That is, when the backside gas is fed into the space 7 through the gas feed hole 4 as shown by the arrows A and B, the gas branches and flows zigzag through the gas flow paths 8 among the embossed portions 5, and finally fills the space 7 and the gas flow paths 8. The embossed portions 5 are provided at the gas-feeding surface of the electrostatic chuck from the standpoint of controlling the adsorbed state of the semiconductor wafer. For example, as shown in FIG. 4 by way of example, a number of embossed portions 5 are regularly formed on the gas-feed surface 3a.

The present inventors tried to keep the entire surface of the semiconductor wafer at 100 to 200° C. with use of such an electrostatic chuck by arranging a water-cooled flange not shown at a side of the rear surface 3b of the electrostatic chuck, flowing the backside gas as mentioned above, heating the semiconductor wafer from the upper surface side and simultaneously removing heat of the semiconductor wafer with the water-cooled flange through the electrostatic chuck. As a result, heat spot(s) locally appeared in the semiconductor wafer.

Figure 3:
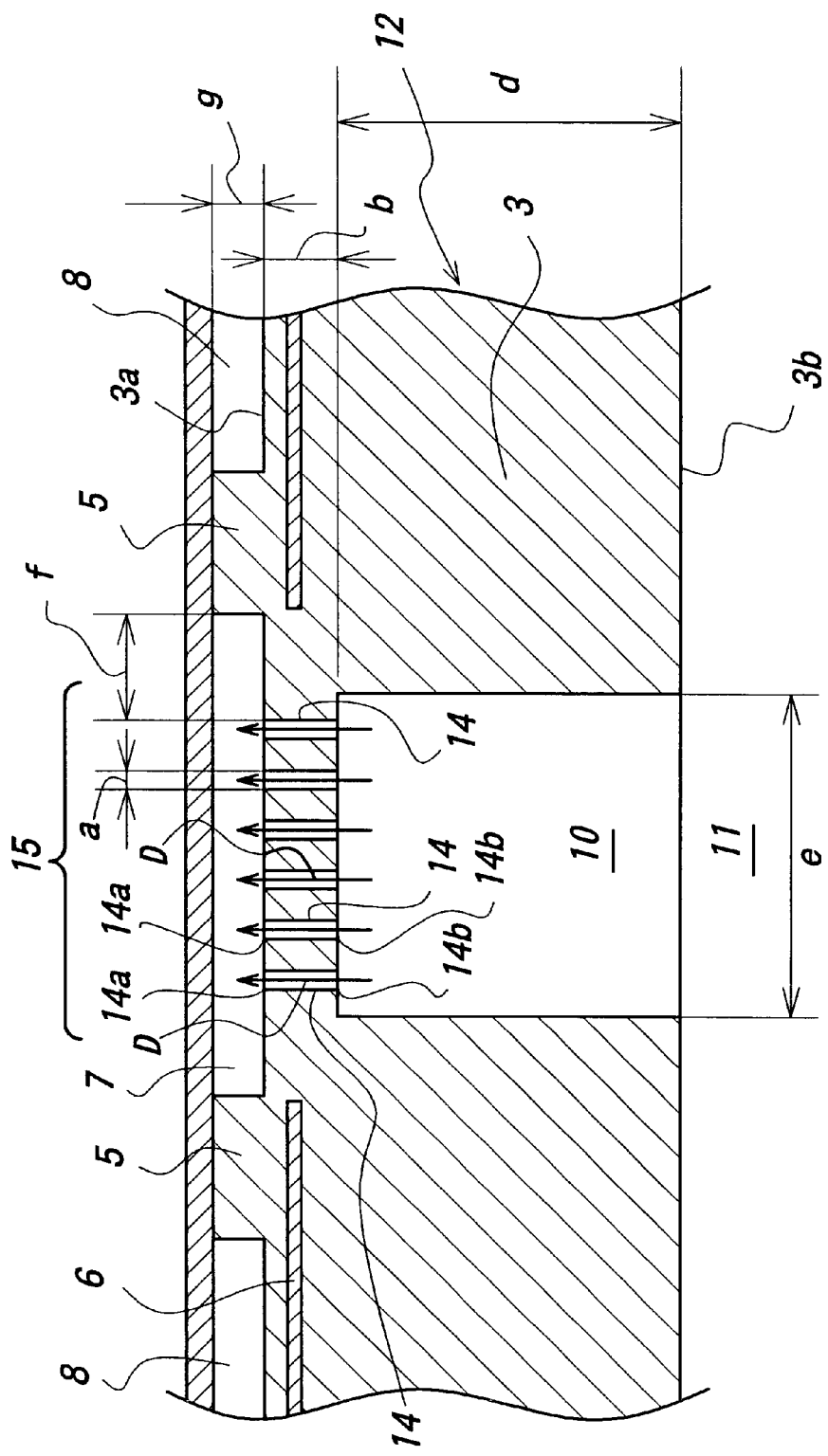
FIG. 3 is a sectional view of a part of an electrostatic chuck as another embodiment of the present invention.
Figure 4:
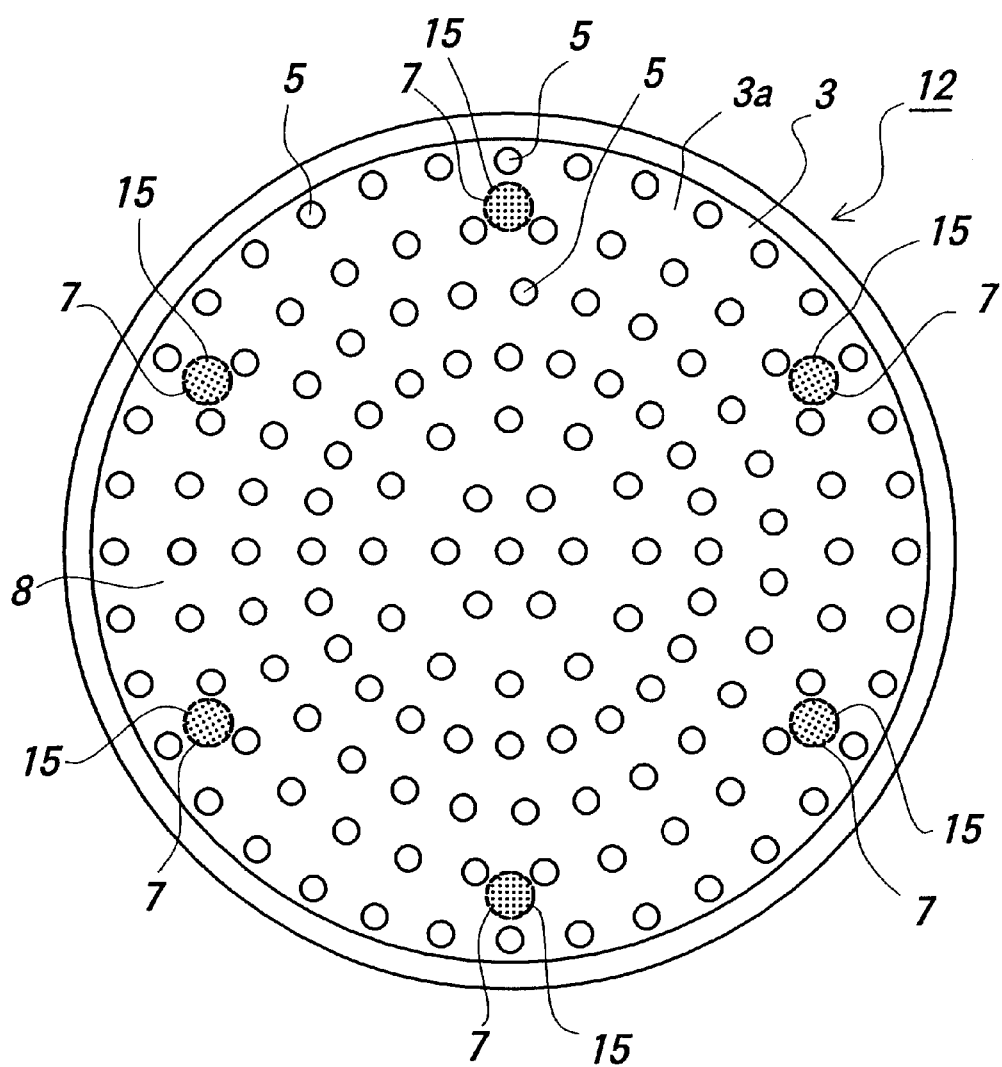
FIG. 4 is a plane view of schematically illustrating the electrostatic chuck in FIG. 3.
Figure 5:
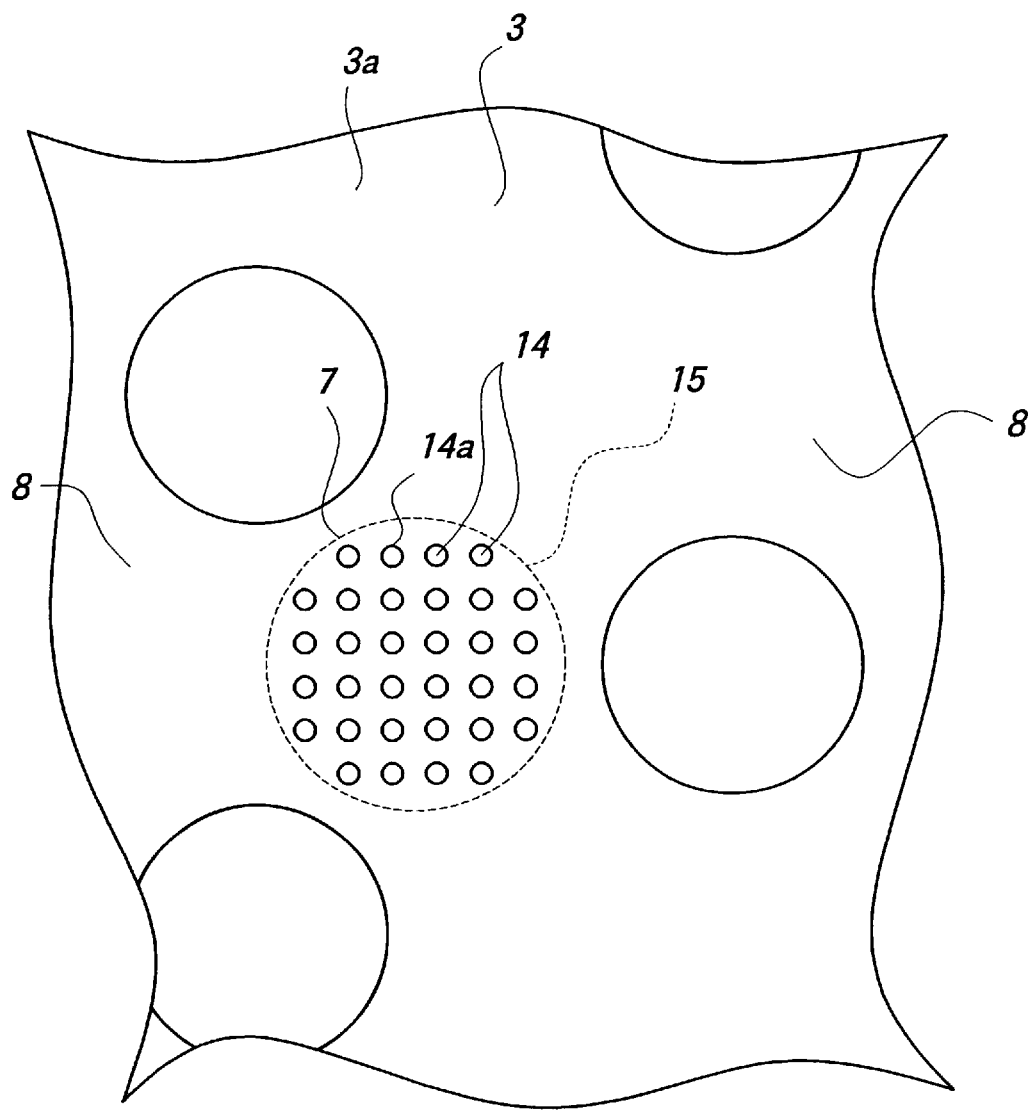
FIG. 5 is an enlarged view of a part of FIG. 4.

On the other hand, FIG. 3 is a sectional view of a part of an electrostatic chuck 12 as another embodiment of the present invention, FIG. 4 is a plane view of schematically illustrating the entire electrostatic chuck FIG. 3, and FIG. 5 is an enlarged view of a part of FIG. 4. In FIGS. 4 and 5, no semiconductor wafer is shown for simplicity.

A substrate of the electrostatic chuck 12 is made of a ceramic material in an almost round discoid shape in this embodiment. A semiconductor wafer 1 is placed and electrostatically attracted onto a gas-feeding surface 3a of the substrate 2. As shown in FIG. 4, a number of embossed portions 5 in the form of almost round projections are regularly arranged at the gas-feeding surface 3a. The shape and the arranged pattern of the embossed portions should be determined according to the attraction performance required for the electrostatic chuck, and as a matter of course are not limited to those shown in FIG. 4. When the semiconductor wafer 1 is placed on the gas-feeding surface 3a of the substrate 3, the wafer directly contacts upper faces of the embossed portions 5. Near the gas-feed surface 3a of the substrate 3 is buried a planar electrostatic chuck electrode 6. To the electrode 6 is connected a conductive terminal not shown.

Depressions 10 are formed in the substrate 3 of the electrostatic chuck at given locations, opening to the rear surface 3b, and thin portions 15 are formed between the depressions 10 and the gas-feeding surface 3a. A plurality of gas feed holes 14 are formed in each of the thin portion. One end opening 14a of each gas feed hole 14 is formed at the placing surface 3a, and the other 14a facing the depression 10.

When the semiconductor wafer is to be subjected to plasma etching or film forming, the interior of the chamber is evacuated to vacuum, the semiconductor wafer 1 is placed on the gas-feeding surface of the gas-feeding surface 3a via the embossed portions 5, the semiconductor wafer 1 is electrostatically attracted to the electrostatic chuck by applying DC voltage to the electrode 6, and then the backside gas is led to the rear surface 3b of the substrate 3. This gas flows through the depressions 10, the gas feed holes 14 as shown by arrows D, and blows out into the space 7. Then, the gas enters the gas flow paths 8 among the embossed portions from the space 7. After the backside gas is fed between the semiconductor wafer 1 and the gas-feeding surface 3a, a film-forming gas or an etching gas is introduced into the chamber, a high frequency voltage is applied to the electrode 6 in addition to the DC voltage, and plasma is generated in a space above the semiconductor wafer 1.

The present inventors discovered that heat spots in the semiconductor wafer are shrunk or disappeared by heating it with the above construction.

Although this reason is not clear, it is considered to relate to the flow of the backside gas. That is, in the electrostatic chuck as shown in FIG. 2, the backside gas is fed through a single gas feed hole 4 at each feeding site. The gas must flow almost uniformly through the gas flow paths 8 among the embossed portions.

However, the present inventors particularly noted the microscopic configuration of the hole due to the difficulty of working the ceramics. It is generally difficult to form through-holes in a planar thick ceramic substrate from a gas-feeding surface 3a to a rear surface 3b. For example, if the planar substrate 3 is made of a hard and dense ceramic material such as aluminum nitride, silicon nitride or alumina, for example, it is necessary to exchange a cutting tool on the way of working. Further, since the substrate 3 is thick, it is actually difficult to bore a hole by laser working or etching, because a large taper is formed from one end opening to the other of a gas feed opening. For this reason, ultrasonic mechanical working is necessary. Even in this case, a considerably large taper is formed in a gas feed hole 4 as viewed diametrically, so that the diameter of the one end opening 4a of the gas feed hole 4 differs from that of the other 4a. Such a difference increases with increase in the thickness of the substrate. Further, the substrate cannot be worked at one time over the entire thickness, which produces a stair step-like portion at an inner wall surface of the gas feed hole.

For the above causes, when the backside gas is first flown through the gas feed hole 4, turbulence or swirling occurs in the gas. In this state, the gas blows out through the opening 4a, impinges a semiconductor wafer 1 at a relatively large pressure, and flows to the relatively narrow gas flow paths 8 among the embossed portions 5. Probably, some unbalance occurs in the flow of the gas at this time, which forms a low pressure area with a relatively low gas pressure where the heat transfer from the semiconductor wafer to the electrostatic chuck is suppressed to cause a heat spot.

To the contrary, according to the present embodiment, a single gas feed hole 4 is divided into plural gas feed holes 14. Assuming that the amount of the backside gas required for the entire electrostatic chuck does not change in this case, the diameter of each gas feed hole 14 needs to be smaller than that of the gas feed hole 4. As mentioned above, it is difficult to form small-diameter holes in the ceramic substrate 3. In view of this, a thin wall portion 15 is formed in the substrate 3, and a plurality of the gas feed holes 14 are formed in the thin portion. That is, even small-diameter gas feed holes 14 can be actually formed if their length is small. In addition, if the length of the gas feed hole 14 is shortened, the tapering of the gas feed hole and the occurrence of a step at the inner wall surface thereof can be prevented.

In such a construction, the backside gas once stays in the depression 10. It is considered that since there is no particular factor for causing turbulence or swirling in the depression 10 at that time, almost uniform pressure is kept therein. Then, the gas pass the gas feed holes 14 as shown by the arrows D, and fed to the gas flow paths 8 among the embossed portions 5 through the space 7.

At this time, (a) since almost neither taper nor step are present at the inner wall surface of each gas feed hole 14, turbulence and swirl are unlikely to be formed in the gas feed hole 14. (b) The turbulence and swirling are prevented in the depression 10, and the length of the gas feed hole 14 is far smaller than that of the gas feed hole 4. (c) It is considered that the flow rate of the gas ejecting out from each gas feed hole 14 is a value obtained through dividing the flow rate of the gas ejecting out from the gas feed hole 4 by the number of the gas feed hole 14. Accordingly, the flow rate of the gas ejecting out into the space 7 through each gas feed hole 14 is small, so that an impinge energy of the gas upon the semiconductor wafer is small. It is considered that this suppresses the local formation of a low pressure area in the gas flow paths 8 among the embossed portions 5.

Figure 6:
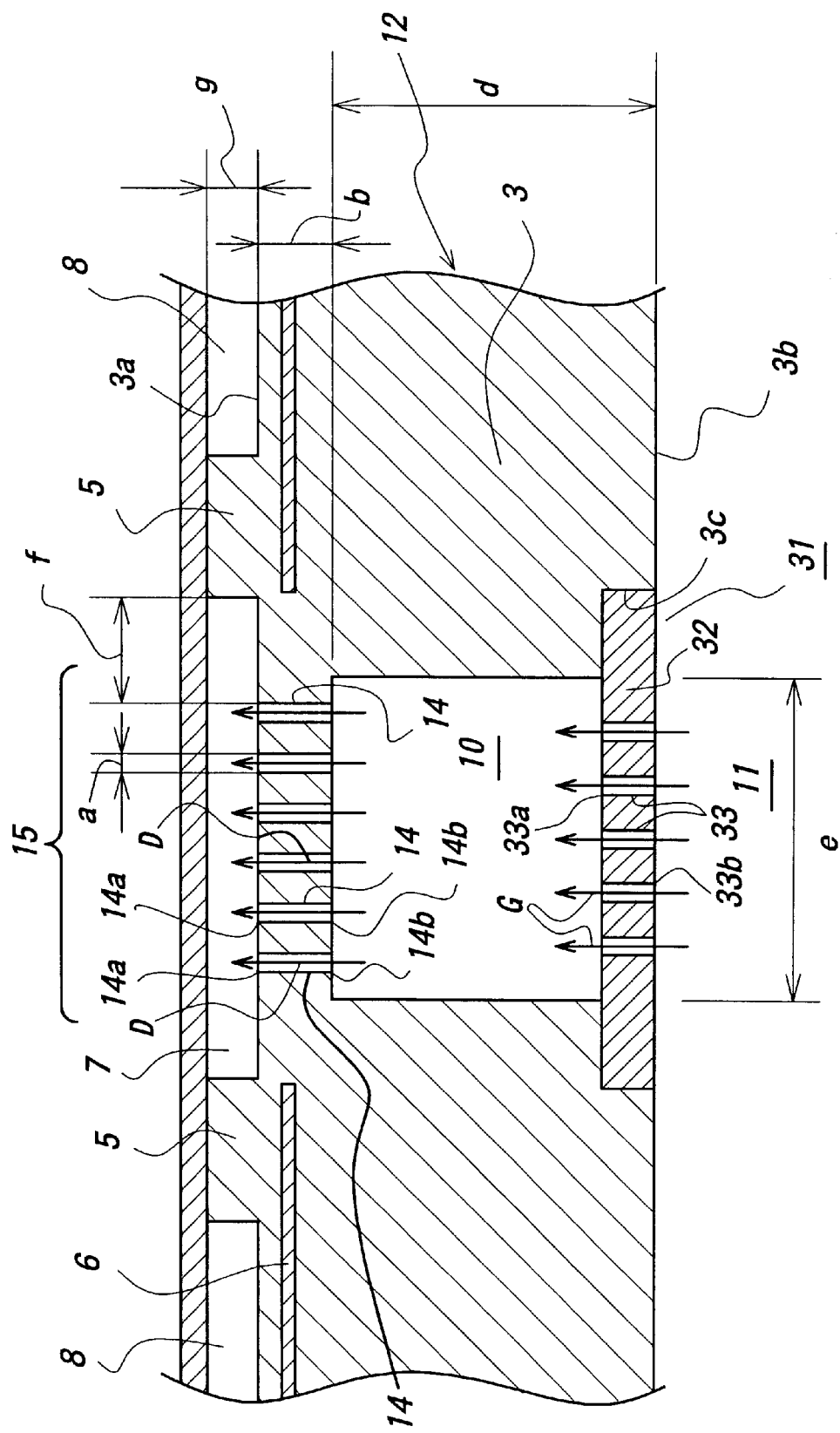
FIG. 6 is a sectional view of a part of an electrostatic chuck as a still further embodiment according to the present invention.

A gas feed structure shown in FIG. 6 is almost the same as that shown in FIG. 3 except that in FIG. 6, a depression 3c is provided at the rear surface 3b of the depression 10, and a gas feed member 31 is separately provided in this depression 3c. The gas feed member 31 is made of a planar substrate 32, which covers almost entirely the opening of the depression 10 to the rear surface. A given number of gas feed holes 33 are formed in the substrate 32, and each gas feed hole 33 has one end opening 33a opened to the depression 10 and the other opened to the rear surface 11 side. The backside gas flows the gas feed holes 33 as shown by the arrows G, enters the depression 10, and subsequently flows as mentioned above.

Further, a bulky piece or plural bulky pieces may be charged in the depression. The bulky piece is preferably made of a ceramic material or a ceramic-metal composite material. The bulky piece has any shape such as a spherical shape and a polygonal shape, provided that it has a diameter greater than that that of the gas feed hole 14 or the gas feed hole 33. If necessary, this bulky piece has numerous groves mainly at its outer periphery to define numerous small-diameter gas paths, in cases where a single bulky piece or a small number of bulky pieces are provided in the depression. The single bulky piece or plural bulky pieces are charged in the depression such that the bulky piece(s) may not move within the depression under being pressed. When the bulk piece(s) is (are) charged into the depression, small diameter and longer gas paths are formed in the depression so that the gas may stay longer in the depression to more effectively prevent turbulence and swirling.

Alternatively, ceramic powder may be placed in the depression.

The configuration of the embossed portions is not particularly limited. So long as the upper faces of them are flat, any shape such as a cylindrical shape or a rectangular shape, e.g., a rectangular pillar shape may be employed.

In the case of the cylindrical embossed portion, preferably its diameter is 1 to 8 mm, and its thickness 1 to 8 mm. Further, its height g is preferably 5 to 50 $\mu$m.

A resistive heat generating member may be buried inside the substrate of the electrostatic chuck so that the semiconductor wafer can be heated by applying electric power to the resistive heat generator. Further, a high frequency voltage electrode may be buried.

From the standpoint of attaining the function and the effects of the present invention, the diameter a of the gas feed hole is preferably 150 $\mu$m or less, more preferably 100 $\mu$m. A distance f between the outer gas feed hole and the embossed portion is preferably not less than 3 mm. The height g of the embossed portion is 0.005 to 0.05 mm. The thickness b of each thin portion is preferably not more than 1 mm to prevent the tapering and stepping at the inner wall surface of the gas feed hole. The diameter e and the thickness d of the depression are preferably 3 to 5 mm and 3 to 25 mm, respectively.

The substrate is preferably made of a dense ceramic material. Specifically, the substrate is preferably made of a nitride-based ceramic material such as silicon nitride, aluminum nitride or sialon. When silicon nitride is used, a holding member having highly thermal impact resistance is obtained. When aluminum nitride is used, a holding member having high corrosion resistance against a halogen-based corrosive gas is obtained. Since silicon nitride containing at least one of $Y_2O_3$ and $Yb_2O_3$ as a sintering aid and aluminum nitride containing $Y_2O_3$ as a sintering aid have high heat conductivity values, they are particularly preferred from the standpoint of improving uniform heating of the heating surface of the substrate.

For the electrode and the resistive heat generator in the substrate, metals having high melting points, e.g., tantalum, tungsten, molybdenum, platinum, rhenium, hafnium and alloys thereof may be recited. Among them, tantalum, tungsten, molybdenum, platinum and alloys thereof are preferred.

If the processing gas is a mixture of plural kinds of gases, the gas mixture may be fed into each depression. Alternatively, the gas ingredients may be fed into respective depressions before mixing.

As the backside gas, an inert gas is preferred. Particularly, in a case that an object to be held is heated to a high temperature of not less than 600° C., inert gas is particularly preferred from the standpoint of preventing the reaction between the gas and the ceramics. As the inert gas, argon, helium and nitrogen are preferred. The backside gas before entering the substrate may be at room temperature, heated or cooled below room temperature.

The depression 10 may be relatively easily formed by ultrasonic machining. Since each gas feed hole has a small diameter and a small length, it may be formed by laser working or etching.

EXAMPLE

As shown in the embodiments of the present invention, AlN powder was molded to a given shape, thereby forming a molded body. A metal electrode 6 made of Mo was placed on the molded body, and AlN powder was charged on the molded body, which was molded again, thereby forming a molded body having the metal electrode 6 therein. The resulting molded body was sintered in an nitrogen atmosphere, thereby forming a substrate 3 having a diameter of 200 mm.

Embossed portions 5 made of AlN were formed on the substrate 3. Depressions were formed by machining. The depth d and the diameter e of the depression 10 were 9 mm and 4 mm, respectively, the machining time required was 15 minutes.

The substrate was laser worked by irradiating $CO_2$ laser (wavelength: 10.6 $\mu$m) upon the gas-feeding surface 3a to form 71 gas feed holes in each thin portion. The diameter a and thickness b of the thin portion was 0.1 mm and 0.6 mm, respectively. The time required for laser working was 2 seconds for each gas feed hole.

A silicon wafer having a diameter of 200 mm was placed on the embossed portions of the electrostatic chuck, and the silicon wafer was attracted upon the electrostatic chuck through the generation of an electric field by applying DC voltage to the electrode 6.

Then, a backside gas of helium was introduced and filled uniformly into a space 7 defined between the silicon wafer and the substrate 3 through a pipe not shown, and the silicon wafer was heated to 350° C. with a heating lamp upwardly located. In this state, measurement of the surface temperature of the semiconductor wafer with a thermocouple-provided wafer at 17 points revealed that a difference between the maximum temperature and the minimum temperature was 3° C. and the temperature was stable.

According to the present invention, in the gas feed ceramic structure for feeding the gas in the semiconductor-producing apparatus, the gas can be stably fed over a wide range, the non-uniform flow of the gas can be prevented, and thereby arching can be suppressed.

What is claimed is:

1. A gas feed ceramic structure for feeding a gas into a semiconductor-producing apparatus, comprising a planar ceramic substrate having a gas-feeding surface and a rear surface, the planar ceramic substrate comprising recesses formed from the rear surface toward the gas-feeding surface to define thin portions between the recesses and the gas-feeding surface wherein said recesses are formed in ceramic portions of said planar ceramic substrate, each of the thin portions comprising a plurality of gas feed holes for feeding the gas to a side of the gas-feeding surface of the substrate, one open end of the gas feed holes being provided at the gas-feeding surface of the planar ceramic substrate and the other facing the recesses wherein the inner diameter of each of the gas feed holes is not more than 150 μm.

2. The gas feed ceramic structure set forth in claim 1, wherein the thickness of each of the thin portions is not more than 2 mm.

3. The gas feed ceramic structure set forth in claim 1, wherein at least one of bulky pieces and crushed bulk pieces made of an insulating material are charged in the recesses.

4. The gas feed ceramic structure set forth in claim 2, wherein at least one of bulky pieces and crushed bulk pieces made of an insulating material are charged in the recesses.

5. The gas feed ceramic structure set forth in claim 1, wherein said gas feed ceramic structure is adapted to feed the gas into a space above a semiconductor placed in the semiconductor-producing apparatus, the gas being a semiconductor-processing gas.

6. The gas feed ceramic structure set forth in claim 2, wherein said gas feed ceramic structure is adapted to feed the gas into a space above a semiconductor placed in the semiconductor-producing apparatus, the gas being a semiconductor-processing gas.

7. The gas feed ceramic structure set forth in claim 1, which is to be installed in a semiconductor wafer holder of the semiconductor-producing apparatus and wherein the gas-feeding surface of the planar ceramic substrate-constitutes a semiconductor-placing surface, and the gas is fed between the gas-feeding surface and the semiconductor wafer as a backside gas.

8. The gas feed ceramic structure set forth in claim 2, which is to be installed in a semiconductor wafer holder of the semiconductor-producing apparatus and wherein the gas-feeding surface of the planar ceramic substrate constitutes a semiconductor-placing surface, and the gas is fed between the gas-feeding surface and the semiconductor wafer as a backside gas.

9. The gas feed ceramic structure set forth in claim 1, wherein a plurality of embossed portions are provided projecting from a semiconductor-placing surface of the planar ceramic substrate such that a semiconductor wafer may contact upper portions of the embossed portions, and a space is defined between the semiconductor wafer and the placing surface into which the backside gas is to be fed.

10. The gas feed ceramic structure set forth in claim 2, wherein a plurality of embossed portions are provided projecting from a semiconductor-placing surface of the planar ceramic substrate such that a semiconductor wafer may contact upper portions of the embossed portions, and a space is defined between the semiconductor wafer and the placing surface into which the backside gas is to be fed.

* * * * *